United States Patent [19]
Badger et al.

[11] Patent Number: 5,739,874
[45] Date of Patent: Apr. 14, 1998

[54] TUNING SYSTEM FOR A DIGITAL SATELLITE RECEIVER WITH FINE TUNING PROVISIONS

[75] Inventors: David Mark Badger; John Sidney Stewart, both of Indianapolis; Michael Anthony Pugel, Noblesville, all of Ind.

[73] Assignee: Thomson Consumer Electronics, Inc., Indianapolis, Ind.

[21] Appl. No.: 579,782

[22] Filed: Dec. 28, 1995

Related U.S. Application Data

[63] Continuation-in-part of Ser. No. 467,097, Jun. 6, 1995.

[51] Int. Cl.$^6$ ..................................................... H04N 5/50
[52] U.S. Cl. .................. 348/731; 455/183.2; 455/193.2
[58] Field of Search ............................ 348/731–733, 348/726; 455/192.3, 182.3; 375/324, 326, 327; 337/1 A, 16, 17

[56] References Cited

U.S. PATENT DOCUMENTS

| | | | |
|---|---|---|---|
| 4,977,613 | 12/1990 | Holcomb, Sr. et al. | 455/192.3 |
| 5,179,727 | 1/1993 | Imagawa | 455/192.3 |
| 5,272,452 | 12/1993 | Adachi et al. | 331/17 |
| 5,311,318 | 5/1994 | Dobrovolny | 348/731 |
| 5,325,401 | 6/1994 | Halik et al. | 375/83 |
| 5,450,627 | 9/1995 | Kianush et al. | 455/192.3 |

FOREIGN PATENT DOCUMENTS

0689324A2  12/1995  European Pat. Off. ........ H04L 27/22

OTHER PUBLICATIONS

Data Sheet "MB1507 Serial Input PLL Frequency Synthesizer" Fujitsu Limited, pp. 3–79 to 3–90, 1991.

"DSS II Product Functional Specification", Section 2.3.1 Functional Description DSS II Link Section, Thomson Consumer Electronics, Inc., Revision 4, pp. 1–4, Sep. 22, 1995.

Preliminary Specification, "2.5 GHz bi-directional 12C-Bus Controlled Synthezizer TSA5055T", Phillips Semiconductors, pp. 3489, 3492–3497, Nov. 1991.

Data Sheet, "2.0 GHz PLL Frequency Synthesizers Include On-Board 64/65 Prescalers, MC145200, MC145201", Motorola Inc., pp. 1–20, 1993.

*Primary Examiner*—Victor R. Kostak
*Attorney, Agent, or Firm*—Joseph S. Tripoli; Peter M. Emanuel

[57] ABSTRACT

An economical tuning system for a digital satellite television receiver includes a phase locked loop (PLL) tuning control IC of the which is normally used in a tuning system of a conventional terrestrial broadcast or cable television reciever to control the frequency of the local oscillator (LO). Unfortunately, the PLL IC is only capable of changing the frequency of the LO in relatively large steps. As a result, the operation of a carrier recovery loop which demodulates the digitally encoded IF signal produced by the tuner may be interrupted during a fine tuning mode because the carrier recovery loop may not be able to track frequency changes of the LO. To reduce such possibility, the integrator filter associated with the PLL IC is modified to decrease the rate of change of the LO frequency during the fine tuning mode.

20 Claims, 5 Drawing Sheets

1

TUNING SYSTEM FOR A DIGITAL SATELLITE RECEIVER WITH FINE TUNING PROVISIONS

CROSS REFERENCE TO A RELATED APPLICATION

This application is a continuation-in-part of U.S. patent application Ser. No. 08/467,097, entitled "Tuner For A Digital Satellite Receiver", filed on Jun. 6, 1995 for Michael A. Pugel and Kurt J. Richter.

FIELD OF THE INVENTION

The invention concerns a tuning system for a satellite receiver, especially one capable of receiving and processing television signals transmitted in digital form.

BACKGROUND OF THE INVENTION

Satellite television receiving systems usually comprise an "outdoor unit" including a dish-like receiving antenna and a "block" converter, and an "indoor unit" including a tuner and a signal processing section. The block converter converts the entire range ("block") of relatively high frequency RF signals transmitted by a satellite to a more manageable, lower range of frequencies.

In a conventional satellite television transmission system television information is transmitted in analog form and the RF signals transmitted by the satellite are in the C (e.g., 3.7 to 4.2 gHz) and Ku (e.g., 11.7 to 14.2 gHz) bands. The RF signal received from the satellite by the antenna of the receiving system are converted by the block converter to the L band (e.g., 900 to 2000 mHz). An RF filter section of the tuner of the indoor unit selects the one of the RF signals received from the block converter corresponding to the selected channel, and a mixer/local oscillator section of the tuner converts the selected RF signal to a lower, intermediate frequency (IF) range for filtering and demodulation. Typically, the IF frequency range has a nominal center frequency of 479.5 mHz. Analog satellite television systems typically employ FM modulation, and a baseband video signal is readily obtained from the 479.5 mHz IF signal by an FM demodulator after filtering by an IF filter. A relatively simple surface acoustic wave (SAW) device can provide adequate filtering in an analog satellite television receiver.

In newer satellite television systems, such as the DirecTv™ operated by the Hughes Corporation of California, television information is transmitted in digital form. The RF signals are transmitted by the satellite in the Ku band, and are converted by the block converter to the L band. The frequency range of the RF signals transmitted by the satellite is somewhat smaller (e.g., between 12.2 and 12.7 gHz) than that for the analog satellite television system, and the frequency range of RF signals produced by the block converter is accordingly somewhat smaller (e.g., between 950 and 1450 mHz).

As in the analog satellite television receiving systems, the RF signal corresponding to the selected channel has to be reduced in frequency to an IF frequency range for filtering and demodulation. In a digital satellite receiver, in addition to the normal IF filtering for selecting the desired RF signal and rejecting unwanted RF signals, it is desirable that the IF filter perform what is known as "symbol shaping" to reduce decoding errors due to "inter-symbol interference" caused by bandwidth limitations. However, the symbol shaping function cannot readily be performed at relatively high IF frequencies, such as at the 479.5 mHz IF frequency employed in an analog satellite television receiver, especially when the IF filter comprises a SAW device. As a result, a relatively expensive separate digital filter is required. It is possible to employ a second conversion stage to convert a relatively high frequency (e.g., 479.5 mHz) first IF signal to a second, lower frequency (e.g., less than 100 mHz) IF signal prior to IF filtering. However, the second conversion stage adds undesirable cost to the receiver.

It is also desirable that the tuning system of the digital satellite television receiver be capable of being constructed utilizing components which are already commercially available and therefore relatively inexpensive. Specifically, in this regard it is desirable that the tuning system be capable of being constructed utilizing a commercially available integrated circuit (IC) which incorporates a phase locked loop (PLL) for controlling the frequency of the local oscillator. Since a large number of tuner PLL ICs for conventional television receivers which receive and process conventional terrestrial broadcast and cable television signals are already widely available, it is particularly desirable that the tuning system of a digital satellite television receiver be capable of being constructed utilizing such a conventional tuner PLL IC.

A single conversion tuner for a digital satellite television receiver which permits the use of a SAW filter with symbol shaping capabilities and the use of the type of PLL IC which is conventionally employed in terrestrial broadcast and cable tuning systems is described in the above-identified U.S. patent application. Basically, these two desirable attributes are accomplished by: (1) selecting an IF center frequency in the order of the difference (e.g., 140 mHz) between the highest frequency of the RF signal received from the block converter (e.g., 1450 mHz) and highest local oscillator frequency (e.g., in the order of 1300 mHz) available when employing a conventional terrestrial broadcast and cable tuning control PLL IC; and (2) utilizing a local oscillator signal with a frequency range which is lower then, rather than higher than, the frequency range of the received RF signals.

SUMMARY OF THE INVENTION

A single conversion tuning system for a digital satellite television receiver of the type just described performs very satisfactorily under most operating conditions. However, the present inventors have discovered that due to the characteristics of the block converter of the outdoor unit, the nature of the digital signal demodulation process, and certain limitations of the terrestrial broadcast and cable PLL tuning control IC, the reproduced image may be occasionally interrupted.

More specifically, the conversion stage of the block converter of the outdoor unit usually includes a local oscillator which is not stabilized against variations of temperature and age. The result is that the frequency of the local oscillator signal of the block converter changes, causing a corresponding change of the frequencies of the carrier signals of the RF signals received by the tuner of the indoor unit. As a consequence, the frequency of the IF signal produced by the tuner also changes from its nominal value. If the frequency of the IF signal changes too far from its nominal value, the digital signals modulated on the IF signal cannot be properly demodulated and the information they represent cannot be properly reconstructed. To overcome this problem, the frequency of the local oscillator of the tuner of the indoor unit can be changed during a fine tuning operation in order to compensate for changes in the frequency of the IF signal. If the local oscillator frequency is changed in small enough steps, the operation of the digital demodulator can track the changes and the digital signals will continue to be properly demodulated during the fine tuning operation. However, if the frequency of the local oscillator signal is changed in steps which are too large, the operation of the digital demodulator may not be able to follow the changes and the digital signals may not be properly demodulated during the fine tuning operation. Unfortunately, PLL ICs conventionally employed in terrestrial broadcast and cable tuning systems typically provide for changes of the local oscillator frequency in relatively large steps, e.g., in the order of 62.5 kHz. Accordingly, the use of such a conventional terrestrial tuning control PLL IC in a digital satellite television receiver may result in the interruption of the video and audio responses.

In accordance with an aspect of the invention, in a preferred embodiment of the invention, in which the tuner of a digital satellite television receiver comprises a single conversion stage utilizing a conventional terrestrial tuning control PLL IC for controlling the local oscillator frequency, the speed at which of the PLL arrangement controls the frequency of the local oscillator signal is reduced during a fine tuning mode. This enables the digital data demodulator to more readily track the frequency changes of the IF signal during the fine tuning mode, and thereby reduces the possibility of interruptions of the video and audio responses.

This and other aspects of the invention will be described in detail with reference to the accompanying Drawing.

BRIEF DESCRIPTION OF THE DRAWING

In the Drawing.

In the various Figures, the same or similar reference designations are used to identify the same or similar elements.

DETAILED DESCRIPTION OF THE DRAWING

The invention will be described with reference to a digital satellite television system in which television information is transmitted in encoded and compressed form in accordance with a predetermined digital compression standard, such as MPEG. MPEG is an international standard for the coded representation of moving picture and associated audio information developed by the Motion Pictures Expert Group. The DirecTv™ satellite television transmission system operated by the Hughes Corporation of California is such a digital satellite television transmission system.

In the transmitter, the television information is digitized, compressed and organized into a series or stream of data packets corresponding to respective video and audio portions of the television information. The digital data is modulated on to a RF carrier signal in what is known as QPSK (Quaternary Phase Shift Keying), modulation and the RF signal is transmitted to a satellite in earth orbit, from which it is retransmitted back to the earth. In QPSK modulation, the phases of two quadrature phase signals, I and Q, are controlled in response to the bits of respective digital data streams. For example, the phase is set to 0 degrees (°) in response to a low logic level ("0"), and the phase is set to 180° in response to a high logic level ("1"). The phase shift modulated I and Q signals are combined and the result transmitted as a QPSK modulated RF carrier signal. Accordingly, each cycle of the modulated QPSK carrier indicates one of four logic states, i.e., 00, 01, 10 and 10.

A satellite typically includes a number of transponders for receiving and retransmitting respective modulated RF carriers. In a conventional terrestrial television system, each RF carrier or "channel" contains information for only one television program at a time. Accordingly, to view a program, only the corresponding RF signal needs to be selected. In a digital satellite television system, each modulated RF carrier carries information for several programs simultaneously. Each program corresponds to groups of video and audio packets which are identified by a unique header appended to the packets which identifies the program. Accordingly, to view a program, both the corresponding RF signal and the corresponding packets need to be selected.

Figure 1:
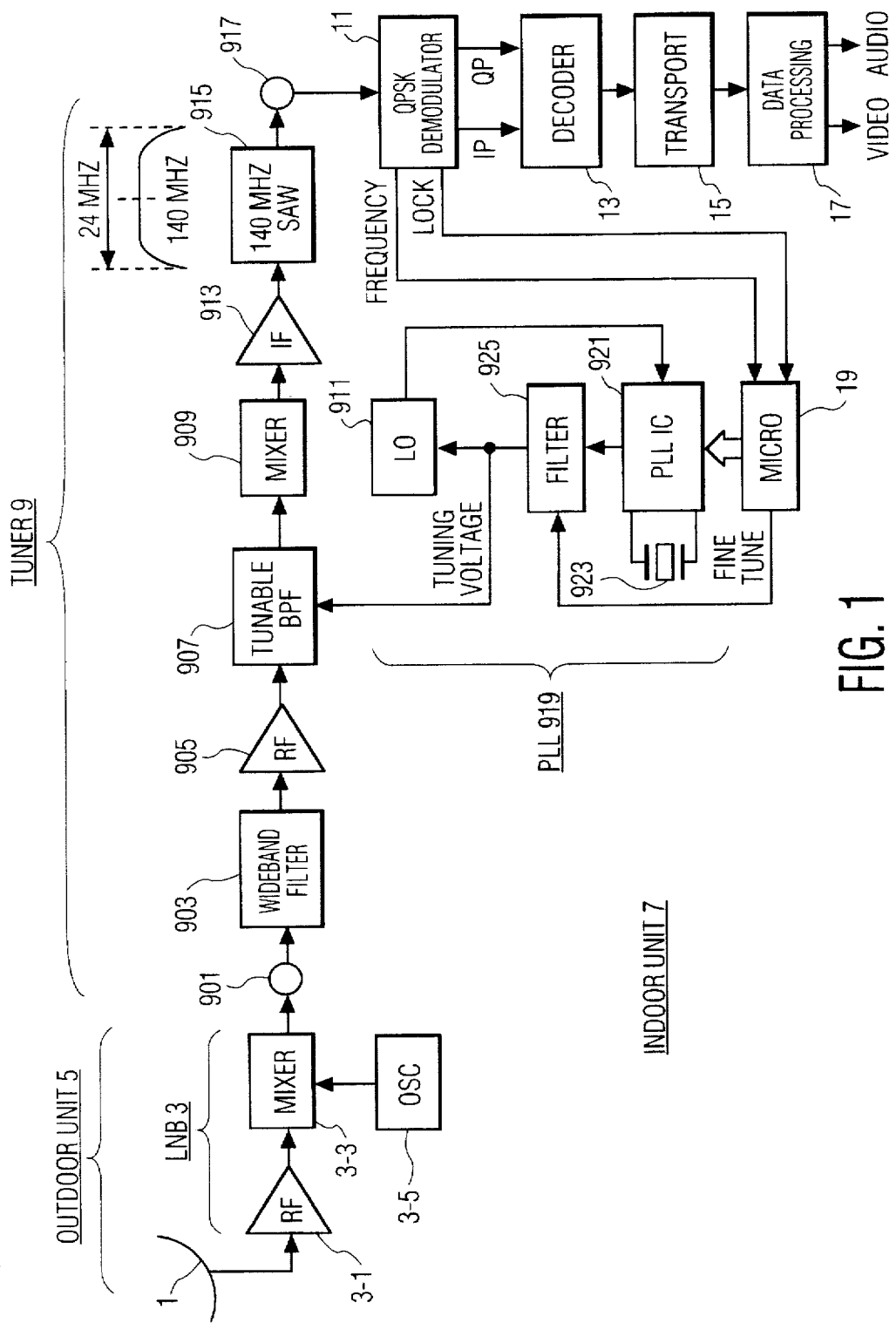
FIG. 1 is a block diagram of a digital satellite television receiver including a tuning system which is constructed in accordance with an aspect of the invention.

In the digital satellite television receiver shown in FIG. 1; RF signals modulated with digital signals representing video and audio information which have been transmitted by a satellite (not shown) are received by a dish-like antenna 1. The relatively high frequency received RF signals (e.g., in the Ku frequency range between 12.2 and 12.7 gHz) are converted by a block converter 3, including a RF amplifier 3-1, a mixer 3—3 and an oscillator 3-5, to relatively a lower frequency RF signals (e.g., in the L band between 950 and 1450 mHz). Amplifier 3-1 is a "low noise" amplifier and is therefore block converter 3 is often referred to by the initials "LNB" for "low noise block converter". Antenna 1 and LNB 3 are included in a so called "outdoor unit" 5 of the receiving system. The remaining portion of the receiver is included in a so called "indoor unit" 7.

Indoor unit 7 includes a tuning system 9 for selecting the RF signal Which contains the packets for the desired program from the plurality of RF signals received from outdoor unit 5 and for converting the selected RF signal to a corresponding lower, intermediate frequency (IF) signal. The present invention is concerned with the construction of tuning system 9 and will be described in detail below.

The remaining portion Of indoor unit 7 demodulates, decodes and decompresses the digital information carried in QPSK modulation form by the IF signal to produce streams of digital video and audio samples corresponding to the desired program, and, thereafter, converts the digital sample streams to respective analog video and audio signals suitable for reproduction or recording. More specifically, a QPSK demodulator 11 demodulates the IF signal to produced two pulse signals IP and QP which contain respective streams of data bits corresponding to the data represented by the phase shift modulated I and Q signals generated in the transmitter. A decoder 13 organizes the bits of the IP and QP signals into data blocks, corrects transmission errors in the data blocks based on error codes which have been embed in the transmitted data at the transmitter, and reproduces the transmitted MPEG video and audio packets. The video and audio packets are routed by a transport unit 15 to respective video and audio sections of a data processing unit 17 where they are decompressed and converted to respective analog signals. A microprocessor 19 controls the operation of various sections of indoor unit 7. However, only the control signals generated and received by microprocessor 19 with which the invention is directly concerned are indicated in FIG. 1.

The digital satellite television receiver described so far is similar to the RCA™ type DSS™ digital satellite system television receiver commercially available from Thomson Consumer Electronics, Inc. of Indianapolis, Ind.

As noted earlier the present invention is concerned with the construction of tuning system 9. Tuning system 9 receives the RF signal provided by LNB 3 at an input 901. The RF input signals are filtered by a wideband filter 903, amplified by an RF amplifier 905, and filtered by a tunable bandpass filter 907. Tunable bandpass filter (BPF) 907 selects the desired RF signal and rejects unwanted RF signals. The resultant RF signal is coupled to a first input of a mixer 909. A local oscillator signal produced by a local oscillator (LO) 911 is coupled to a second input of mixer 909. The output of mixer 909 is amplified by an amplifier 913 and coupled to the input of an IF filter 915 comprising a SAW device. The output of IF filter 915 is coupled to output 917 of tuning system 9.

The frequency of LO 911 is controlled by a phase locked loop (PLL) arrangement 919 comprising a PLL integrated circuit (IC) 921, an external frequency reference crystal 923 and an external filter network 925. The frequency of the LO signal is controlled by PLL 919 in accordance with data generated by a microprocessor 19. Details of PLL 919 are shown in FIG. 2.

Figure 2:
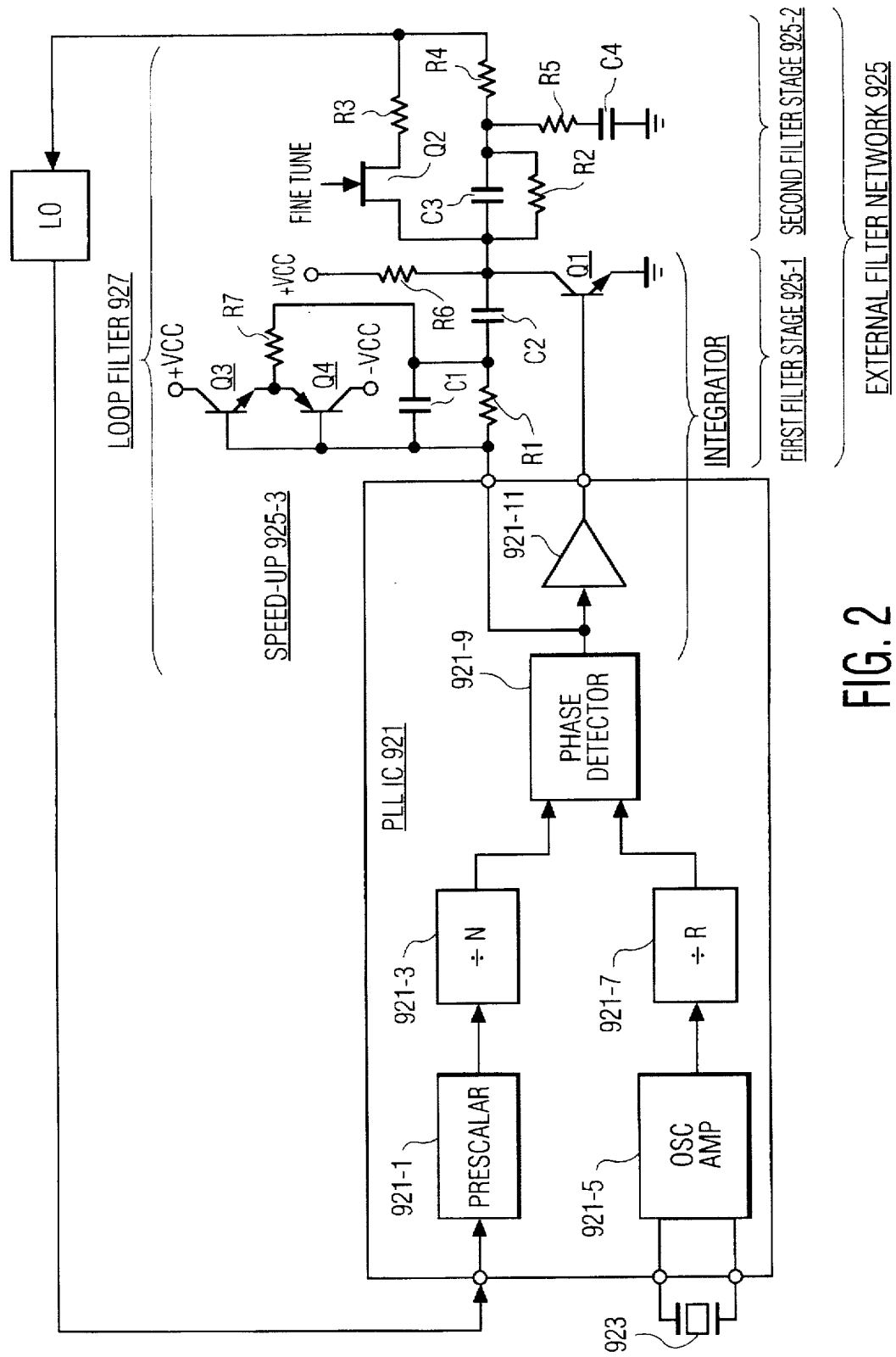
FIG. 2 includes a block diagram of a phase locked loop tuning control integrated circuit used in the tuning system shown in FIG. 1 and a schematic diagram of a circuit implementation of a controllable phase locked loop filter which is constructed in accordance with another aspect of the invention.

As is shown in FIG. 2, the PLL IC 921 includes a "prescalar" frequency divider 921-1 for dividing the frequency of the LO signal followed by a programmable frequency divider (÷N) 921-3. PLL IC 921 also includes an amplifier 921-5, which in combination with external crystal 923, comprises a reference frequency oscillator. The output of the reference frequency oscillator is coupled to the input of a reference frequency divider (÷R) 921-7. The output signals of programmable divider (÷N) 921-3 and reference divider (÷R) 921-7 are coupled to respective inputs of a phase detector 921-9. The output signal of phase detector 921-9 is an error signal which represents the frequency and phase differences between the frequency divided version of the LO signal produced at the output of programmable divider (÷N) 921-3 and the reference signal produced at the output of reference divider (÷R) 921-7. The error signal contains pulses which have either a relative positive polarity or a relatively negative polarity depending on the sense of the phase and frequency differences between the input signals of phase detector 921-9 and a variable duration which depends on the magnitude of the phase and frequency differences. The error signal is coupled to an amplifier 921-11, which together with external filter network 925, comprises a loop filter 927, for filtering the error signal to produce a tuning control voltage for LO 911. The tuning control voltage also controls tunable bandpass filter 907. Loop filter 927 is constructed in accordance with an aspect of the invention and will be described in detail below.

In operation, the frequency of the LO signal is controlled in response to the tuning voltage until the frequency and phase of the frequency divided version of the LO signal produced at the output of programmable divider (÷N) 921-3 are substantially equal to the frequency and phase of the reference signal produced at the output of reference divider (÷R) 921-7. At that point, the phase locked loop is "locked" and the frequency of the LO signal is proportionally related to the frequency of the reference frequency signal produced by reference frequency divider (÷R) 921-7 by the programmable division factor (N) of programmable divider (÷N) 921-3. Programmable division factor N is controlled in response to data generated by microprocessor 19 in order to control the LO frequency.

For cost reasons, it is desirable that tuning system 9 have the following three characteristics: (1) comprise only a single conversion stage prior to the IF filter stage; (2) provide an IF signal with a low enough frequency to allow a SAW device to be used for so called "digital symbol shaping", as well as normal IF filtering; and (3) be capable of being constructed utilizing a PLL tuning control IC conventionally used for broadcast and cable receivers. Basically, these goals are accomplished by: (1) selecting an IF center frequency to be in the order of the difference (e.g., 140 mHz) between the highest frequency of the RF signal received from the block converter (e.g., 1450 mHz) and highest local oscillator frequency (e.g., in the order of 1300 mHz) available by utilizing a conventional terrestrial broadcast and cable tuning control PLL IC; and (2) utilizing a local oscillator signal with a frequency range which is lower than, rather than higher than, the frequency range of the received RF signals. In the exemplary tuning system the center frequency of the IF signal is 140 mHz. However other IF frequencies are possible utilizing the guidelines set forth above.

A relatively low IF center frequency, e.g., in the order of 140 mHz, allows a single conversion tuner rather than a more expensive double conversion tuner to be used prior to the IF filter section. It also allows a SAW device which provides so called "digital symbol shaping", as well as normal IF filtering, to be used. In a digital transmission system, what is known as "digital symbol shaping" is performed in the transmitter to reduce inter-symbol interference due to transmission bandwidth limitations. It is also desirable to perform digital symbol shaping in the receiver to complement the digital symbol shaping performed in the transmitter. Moreover, it is desirable that the IF filter provide for symbol shaping, as well as the normal IF filtering function, so that a separate digital filter not be required. By way of example, what is known in the digital filter arts as a "root raised cosine" response is suitable for digital symbol shaping. IF SAW filter 915 has such a response. The amplitude versus frequency characteristic of SAW filter 915 is shown in FIG. 1. It has a center frequency at 140 mHz and a relatively flat passband of about 24 mHz corresponding to the bandwidth of the received RF signals. A SAW filter with these characteristics utilizing a lithium tantalate substrate is described in detail in U.S. patent application Ser. No. 08/467,095 entitled "SAW Filter for a Tuner of a Digital Satellite Receiver", filed on Jun. 6, 1995 for K. J. Richter, M. A. Pugel and J. S. Stewart, and which is assigned to the same assignee as the present application.

In addition, with an IF center frequency of 140 mHz and a RF input frequency range between 950 and 1450 mHz, the LO frequency range is between 810 and 1310 mHz. The 810–1310 mHz frequency range of the LO signal permits PLL tuning control ICs which are conventionally and widely used for broadcast and cable receivers, and therefore relatively inexpensive, to be used rather than a PLL tuning control IC especially-designed for satellite receivers. Such a broadcast and cable PLL tuning control IC is the TSA5515T commercially available form Philips Semiconductors of the Netherlands and others. The maximum LO frequency available using the TSA5515T and similar ICs is in the order of 1300 mHz, which is adequate.

The portion of tuning system 9 described so far is the subject matter of the above-noted U.S. patent application Ser. No. 08/467,097 entitled "Tuner of a Digital Satellite Receiver" filed on Jun. 6, 1995 for M. A. Pugel and K. J. Richter, and which is also assigned to the same assignee as the present application. The present invention is specifically concerned with provisions for controlling LO 911 during acquisition and fine tuning operation, which will now be described.

Figure 3:
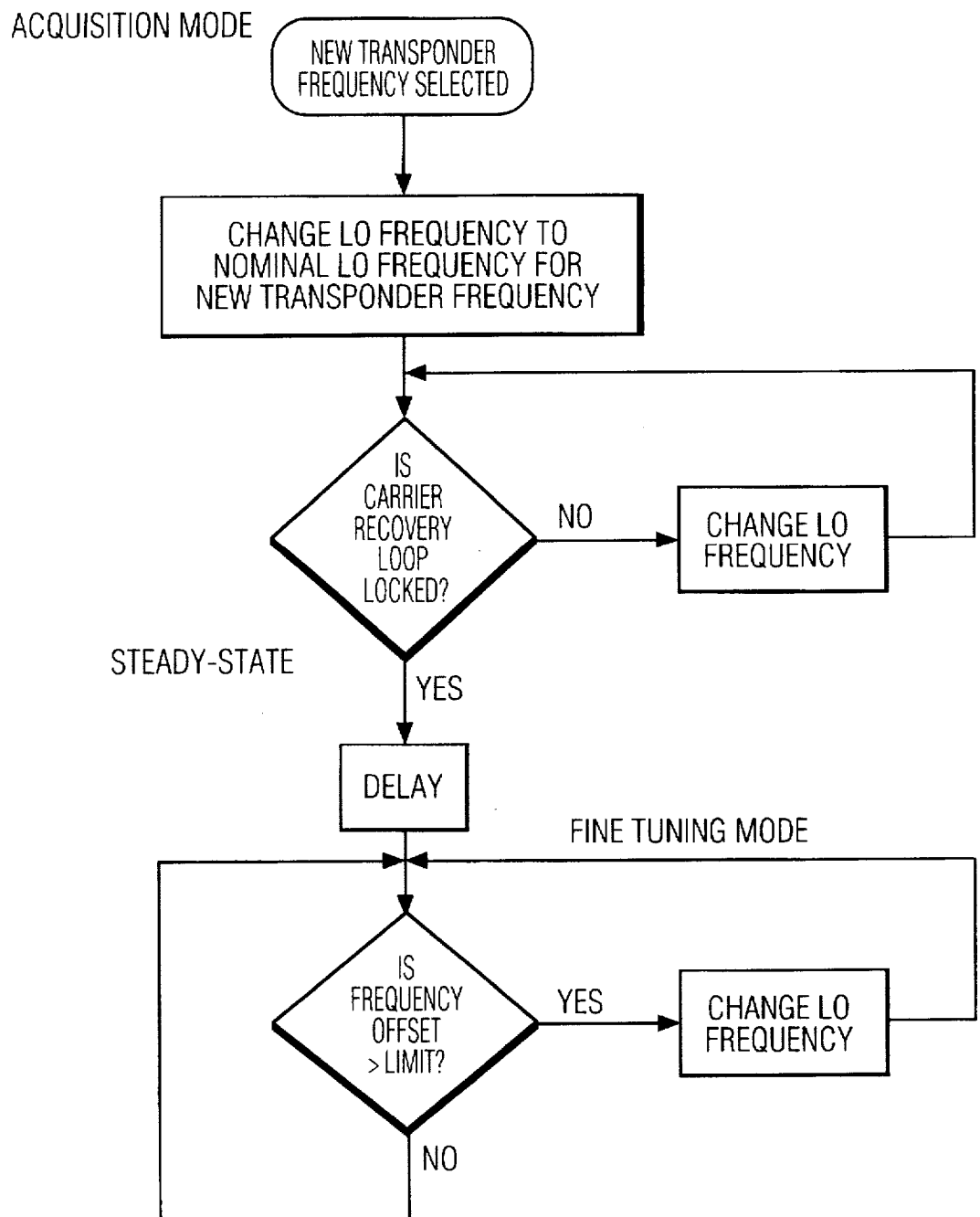
FIG. 3 is a flow chart of a microprocessor control program for the tuning system shown in FIG. 1 in accordance with another aspect of the invention.

The carriers of the RF signals transmitted by the satellite and received by antenna 1 have very stable frequencies which remain at "nominal" values. Therefore, as long as the frequency of oscillator 3-5 of LNB 3 is stable and remains at its nominal value, the frequencies of carders of the. RF signals received by tuning system 9 of indoor unit 7 will be at their nominal values. Unfortunately, the frequency of oscillator 3-5 can change with time and temperature. The frequency offset of the oscillator 3-5 with respect to its nominal frequency cause corresponding offsets of carrier frequencies of the RF signals received by tuning system 9. To compensate for these frequency offsets, the frequency of the LO 911 of tuning system 9 is changed under the control of microprocessor 19 in response to frequency-status information received from QPSK demodulator during two Search operations. The flow chart of the control program of microprocessor 19 for tuning system 9, including the search operations, is shown in FIG. 3.

A first search may occur during an acquisition mode after a new program is initially selected. When a new program is selected, microprocessor 19 causes the LO frequency to be set to a nominal LO frequency corresponding to the nominal RF frequency of the transponder for the new program. Thereafter, the status of a LOCK signal generated by QPSK demodulator 11 is monitored. The LOCK signal indicates whether or not QPSK demodulator 11 is operating correctly to demodulate the digital data carded by the IF signal. For example, the LOCK signal has a low logic level when QPSK demodulator 11 is not properly demodulating the digital data, and the LOCK signal has a high logic level when QPSK demodulator 11 is properly demodulating the digital data. If the LOCK signal has the low logic level after the LO frequency has been set to the nominal LO frequency for the selected transponder, the frequency of LO 911 is changed a range surrounding the nominal LO frequency until the LOCK signal has the high logic level. The generation of the LOCK signal indicates the beginning of a steady-state operating mode of tuning system 9.

During the steady-state mode, a FREQUENCY signal generated by QPSK demodulator 11 is monitored to determine whether or not the frequency of the carrier of the IF signal is centered within the passband of IF SAW filter 915, i.e., if the frequency of the carrier of the IF signal is at the nominal IF center frequency, e.g., 140 mHz in the present embodiment. The performance of the QPSK demodulator 11 will be degraded and data errors will occur if the frequency of the IF carrier falls outside of a predetermined range surrounding the nominal center frequency. If the FREQUENCY signal indicates that a predetermined frequency offset has not been exceeded, the frequency of LO 911 is left changed from the initial value established during the acquisition mode. However, if the FREQUENCY signal indicates that a predetermined frequency offset has been exceeded, the frequency of LO 911 is changed during a, second or "fine tuning" search operation until the situation is corrected. The present invention is directed to solving a problem which may occur during the fine tuning mode, as will now be explained.

Tuning system 9, comprising terrestrial broadcast and cable PLL IC 921, has been found to perform very satisfactorily under most circumstances. However, terrestrial tuning PLL IC 921 has certain limitations which may result in the temporary loss of video and/or audio information. The size of the smallest frequency changes of a local oscillator controlled by a phase locked loop is related to the value of smallest possible increments of programmable division factor (N) of programmable divider (+N) and to the frequency of the reference signal of PLL IC 921. Terrestrial tuning PLL ICs, such as the TSA5515T, are capable of changing the frequency of the LO signal only in relatively large incremental frequency steps, e.g., 62.5 kHz. As a result, during the two search operations, the frequency of the carrier of the IF signal will change in the same relatively large steps. Unfortunately, QPSK demodulator 11 may not be able to track such relatively large frequency steps thereby possible causing an interruption of proper demodulation operation and a loss of video and audio data.

If a first search operation occurs during the acquisition mode, the loss of data is not noticeable because it is expected by a viewer that the acquisition process for a new program will take some time. However, should the second or fine tuning operation become necessary during the steady-state mode, the video and/or audio responses of the program presently be viewed may be interrupted. In accordance with an aspect of the invention, the possibility of such interruptions is reduced by reducing the "slew rate" of PLL arrangement 919, i.e., the rate at which the tuning voltage is allowed to change amplitude, during the fine tuning operation. More specifically, the response time of loop filter 927 is increased in response to a FINE TUNING control signal generated by microprocessor 19. The problem to which this aspect of the invention will now be described in greater detail with respect to FIGS. 4, which shows a block diagram of an implementation of QPSK demodulator 11.

Figure 4:
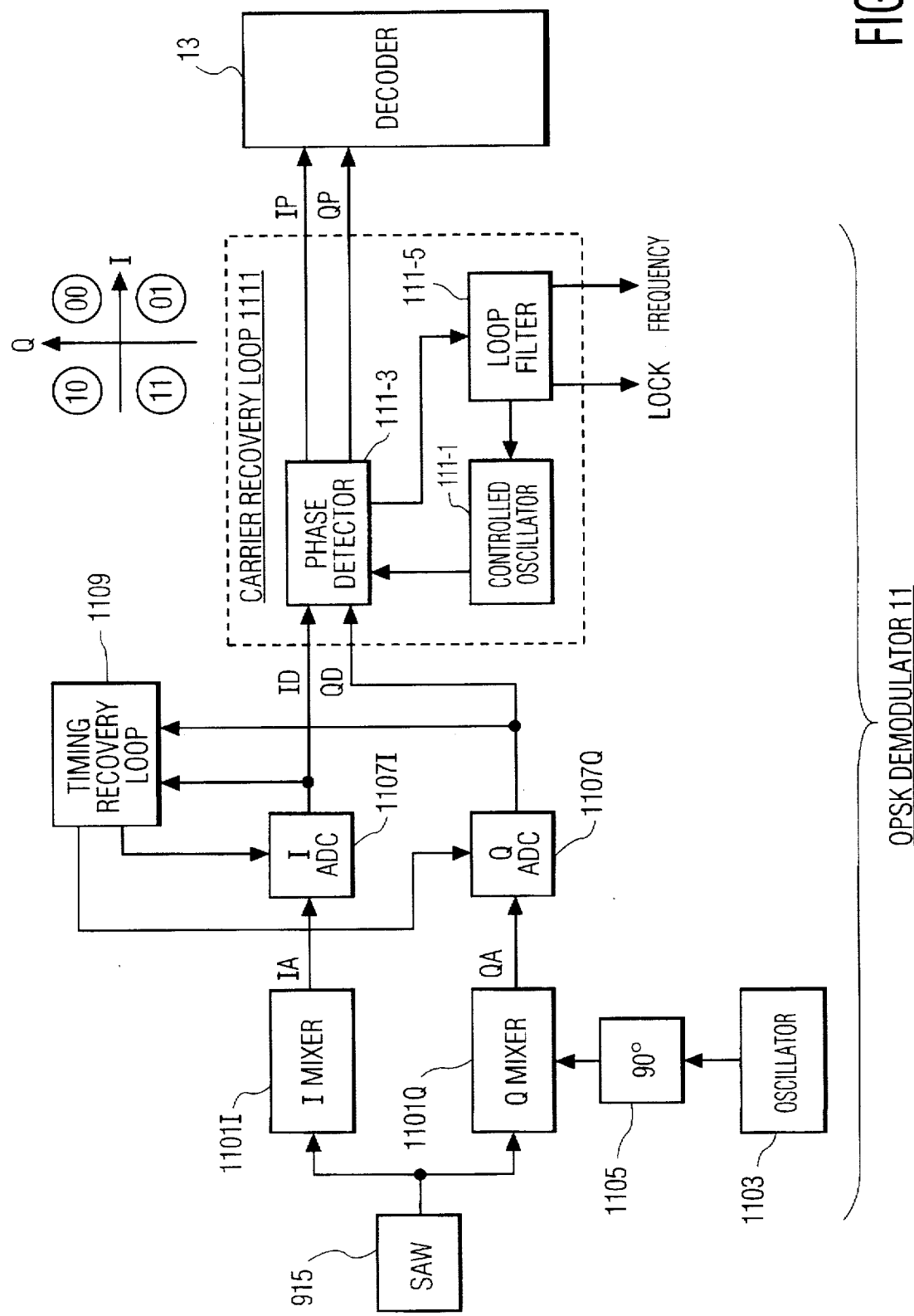
FIG. 4 is a block diagram of a digital data demodulator for use in the satellite receiver shown in FIG. 1 and useful in understanding a problem solved in accordance with an aspect of the invention.

As shown in FIG. 4, the IF signal produced by IF SAW filter 915 is coupled to respective first inputs of mixers 1101I and 1101Q. The letters "I" and "Q" signify "in-phase" and "quadrature". The output signal of a relatively stable frequency oscillator 1103 is directly coupled to mixer 1101I and indirectly coupled to mixer 1101Q via a 90 degree (90° ) phase shift network 1105. Mixer 1101I produces an "in-phase", "near" baseband (much lower frequency) version (IA) of the IF signal, while mixer 1101Q produces an "quadrature", near baseband version (QA) of the IF signal, which is shifted 90 degrees with respect to the "in-phase" signal (IA). The letter "A" signifies "analog".

The IA and QA signals are coupled to respective analog-to-digital converters (ADCs) 1107I and 1107Q. Analog-to-digital converters 1107I and 1107Q also receive a clock signal from a "timing recovery loop" 1109 and produce respective series of digital samples ID and QD. The letter "D" signifies "digital". The frequency and phase of the clock signal determines the frequency digital samples and also the phase of the digital samples of the ID and QD digital signals relative to the IA and QA analog signals. Timing recovery loop 1109 includes a controlled oscillator (not shown) from which the clock signal for ADCs 1107I and 1107Q is derived. The controlled oscillator is controlled by a digital phase locked loop (not shown) so that the digital samples are synchronized with corresponding amplitude levels of the IA and QA analog signals, i.e., the maximum and minimum sample values correspond to the maximum and minimum amplitudes of the analog signals. In other words, timing recovery loop 1109 synchronizes the sampling operation of ADCs 1107I and 1107Q with the IF signal.

The ID and QD signals are also coupled to a "carrier recovery loop" 1111. Carrier recovery loop 1111 demodulates the phase shifts of the IA and QA analog signals represented digital sample signals ID and QD so as to form respective pulse signals IP and QP. The letter "P" signifies "pulse". Each of the IP and QP pulse signals contain a series of pulses corresponding to data bits. The data bits have either a logic low ("0") level or logic high ("1") level corresponding to 0° and 180° phase shifts, respectively, of the I and Q signals of the transmitted QPSK RF carrier. The IP and IQ signal components are coupled to decoder 13, where the various data bits are formatted into MPEG data packets.

Carrier recovery loop 1111 includes a digital phase locked loop (PLL) comprising a controlled oscillator 1111-1, a phase detector 1111-3 and a loop filter 1111-5. Phase detector 1111-3 generates a phase error signal in response to the ID and QD signals and to the output signal of controlled oscillator 1111-1. The nominal frequency and nominal phase of the output signal of controlled oscillator 1111-1 corresponds to the nominal frequency and nominal phase of the IF signal and therefore the nominal frequency and phases of IA and QA analog signals and the corresponding the ID and QD digital sample signals.

In operation, the phase shifts of the signals represented by the ID and QD signals can be reliably determined from the phase error signal if the phase and frequency of the IF signal are correct. However, if the phase and frequency of the IA and QA are incorrect, the detected phase shifts will not be at 0° and 180°, but will instead be shifted from these values. In essence, a phase error causes a "tilt" of the "position" of two-bit demodulated data with respect to the ideal position of the two-bit data in a so called data "constellation". A frequency error, for example, due to a LNB derived frequency offset of the selected RF signal, causes a so called "rotation" of the position of the two-bit demodulated data of the QPSK signal with time. The direction of rotation is dependent on whether the frequency offset is positive or negative. As is shown in FIG. 4, the data constellation for QPSK modulation has four points corresponding to the four possible logic combinations (00, 01, 10 and 11) of the respective two possible logic levels represented by the two possible phase shift values of the I and Q signals. Phase detector 1111-3 measures the position of the demodulated data relative to the ideal position in the data constellation. To correct for data rotation and tilt, the frequency, and thus the phase, of the output signal of controlled oscillator 1111-1 is changed in response to the output signal of phase detector 1111-3 until the rotation stops and the tilt is eliminated. At this point, the demodulated data is reliable and the loop is said to be "locked". A high logic level LOCK signal is generated to indicate that the data is being reliably demodulated and can be decoded. The LOCK signal is generated by examining the derivative of the phase error signal to determine when the change in phase error falls below a predetermined limit. As noted above, during the acquisition mode, the LOCK signal is monitored microprocessor 19 and the frequency of LO 911 is cause to be adjusted by microprocessor 19 until the LOCK signal has a high logic level.

Within limits, the carrier recovery loop 1111 can demodulate the QPSK data even when the frequency of the IF signal, and therefore the frequency of the IA and QA signals, is incorrect or offset. However, if the frequency offset-is too great, a portion of the frequency spectrum of the IF signal will fall outside of the passband of SAW filter 915 due to the shift of the IF signal relative to the center frequency of SAW filter 915. This will cause a degradation of the signal to noise ratio of the receiver. Accordingly, as noted above, microprocessor 19 monitors a FREQUENCY signal generated by carrier recovery loop 1111 to indicate the frequency offset of the IF signal. If the frequency offset exceeds a predetermined limit, microprocessor 19 causes the LO frequency to be adjusted to reduce the frequency offset during the fine tuning mode. The FREQUENCY signal is generated by integrating the phase error detected by phase detector 1111-3.

As noted above, the frequency of the LO signal, and therefore the frequency of the IF signal, changes in relatively large frequency steps, e.g. 62.5 kHz, and it may not be possible for QPSK demodulator 11 to track such relatively large frequency steps. As a result, an interruption of proper demodulation operation and a loss of video and audio data may occur. The ability of QPSK demodulator 11 to track the relatively large frequency changes is a function of the loop bandwidth of carrier recovery loop 1111, and more specifically the response of loop filter 1111-5. The loop bandwidth of carrier recovery loop 1111 should not be made arbitrarily large so as to decrease its response time because an increased loop bandwidth would degrade the signal to noise characteristics of the receiver and therefore the capability of the receiver to receive low level signals. It is also not desirable to decrease the loop bandwidth of PLL 919 so as to decrease its response time because a decreased response time would result in excessively long acquisition times when new transponder frequencies are selected. As noted above, to reduce possibility of the interruption of the demodulation process during the fine tuning operation, the response time of tuning control PLL 919 is selectively increased to reduce the rate at which the tuning voltage, and therefore the frequency of LO 911, is allowed to change during the fine tuning operation. This solution will now be described in detail.

Referring back to FIG. 2, and more particularly to the portion of the circuit labeled "LOOP FILTER 927". As described before, loop filter 927 includes amplifier 921-11 within PLL IC 921 and an external filter network 925. External filter network 925 includes a first filter stage 925-1 and a second, controllable filter stage 925-2 which are coupled in cascade between internal amplifier 921-11 and LO 911.

First filter stage 925-1 and amplifier 921-11 pf PLL IC 921 form an intergrator. More specifically, first filter stage 925-1 includes a bipolar transistor Q1 arranged as a common-emitter amplifier. The base of transistor is connected to the output of amplifier 921-11 via an IC terminal. The emitter of transistor Q1 is connected to signal ground. A load resistor R6 is connected between the collector of transistor Q1 and a source of a supply voltage (+VCC). A filter section, including a resistor R1 and capacitors C1 and C2, is connected in a negative feedback path between the collector of transistor Q1 and the input of amplifier 921-11 via an IC terminal to complete the integrator. The feedback is negative due to the signal inversion provided by common-emitter configured transistor Q1.

The use of an integrator comprising amplifier 921-1 and first filter stage 925-1 connected in a negative feedback configuration makes PLL 919 a type II phase locked loop. A type II phase locked loop minimizes both the phase and frequency differences between the frequency divided version of the LO signal developed at the output of programmable frequency divider (÷N) 921-3 and the reference frequency signal developed at the output of reference frequency divider (÷R) 921-7, and therefore stabilizes both the phase and frequency of the LO 911.

Second filter stage 925-2 includes a two double-pole, double-zero filter section, including resistors R2, R4 and R5 and capacitors C3 and C4, and an electronically controlled switch section comprising field-effect transistor Q2 and relatively low value resistor R3. The conduction state of transistor Q2 is controlled in response to the FINE TUNE signal generated by microprocessor 19. Second filter section 925-2 is selectively controlled to either effectively by-pass the double-pole, double-zero filter section (R2, R4, R5, C3 and C4), or to include the double-pole, double-zero filter section in the path between first filter section 925-1 and LO 911. More specifically, when tuning system 9 is not in the fine tuning mode of operation, the FINE TUNE signal has a low logic level and the conduction channel of transistor Q2 is caused to be in the low impedance state, or "on". As a result, elements resistors R2, R4 and R5 and capacitors C3 and C4 of second filter section 925-2 are effectively by-passed due to "on" transistor Q2 and relatively low value resistor R3. In the fine tuning mode, the FINE TUNE signal has a high logic level and the conduction channel of transistor Q2 is caused to be in the high impedance state, or "off". As a result, resistors R2, R4 and R5 and capacitors C3 and C4 of second filter section 925-2 are connected in the path between first filter section 925-1 and LO 911.

The Bode amplitude versus frequency characteristic for double-zero filter section (R2, R4, R5, C3 and C4) of second filter stage 925-2 by itself is shown in Figure as characteristic #1. Amplitudes levels are indicated in decibels (dB) and the frequency axis is logarithmic. Characteristic #1 is seen to contain two "poles" P1 and P2 and two "zeros" Z1 and Z2, which occur in the order: pole P1, zero Z1, zero Z2 and pole P2 at successively higher frequencies. Pole P1 is due to resistor R2 and capacitor C4; zero Z1 is due to resistor R2 and capacitor C3; zero Z2 is due to resistor R5 and capacitor C4; and pole P2 is due to resistor R5 and capacitor C-3.

Figure 5:
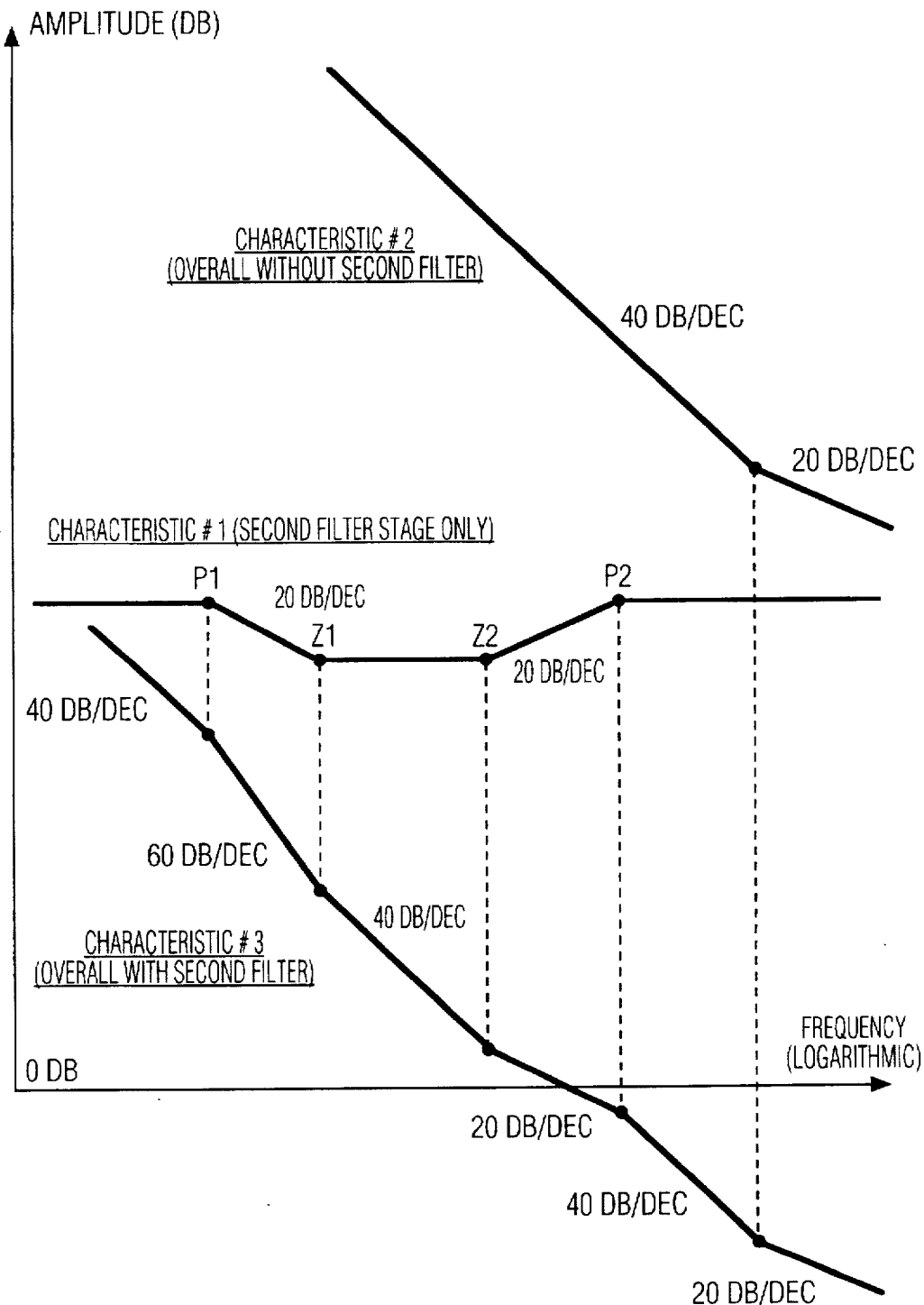
FIG. 5 shows a graphical representations of amplitude versus frequency response characteristics associated with the controllable phase locked loop filter shown in FIG. 2.

Two Bode amplitude versus frequency characteristics of the overall loop response of PLL 919 are also shown in FIG. 5. Characteristic #2 is the loop response when tuning system 9 is not in the fine tuning mode and loop filter 927 includes only first filter stage 925-1, i.e., the double-pole, double-zero filter section (R2, R4, R5, C3 and C4) of second filter stage 925-2 is by-passed. Characteristic #3 is the loop response when tuning system 9 is in the fine tuning mode and loop filter 927 includes first filter stage 925-1 and the double-pole, double-zero filter section (R2, R4, R5, C3 and C4) of second filter stage 925-2 coupled in cascade. Characteristic #2 has not been drawn to scale in terms of amplitude with respect to characteristics #1 and #2 to avoid an overlap of the characteristics.

Recalling that the overall amplitude versus frequency characteristic of two stages connected in cascade results is the multiplicative product of the two individual characteristics, or the additive product when amplitudes are expressed in decibel (dB) levels, characteristic #3 results from the additive combination of characteristics #1 and 2. A pole of characteristic #1 causes an increase of the slope (in the negative direction) of characteristic #3. A zero of characteristic #1 causes a decrease of the slope (in the negative direction) of characteristic #3. Pole P1 reduces the overall loop gain and thereby the overall loop bandwidth. Without zeros Z1 and Z2, the slope of characteristic #3 would cross the 0 dB amplitude level with a slope of greater than 20 dB per decade of frequency, causing the loop to be unstable and thereby subject to oscillations. Pole P2 occurs incidentally due to the circuit topology requiring resistor R5 and capacitor C3. Nevertheless, pole P2 is advantageous in that it reduces the loop gain (i.e., increases the attenuation) for out-of-band signals such as the reference frequency signal of PLL 919.

It is seen in FIG. 5 that when tuning system 9 is not in the fine tuning mode (characteristic #2) the loop bandwidth is relatively large and therefore the response of PLL 919 is relatively fast. In contrast, when tuning system 9 is in the fine tuning mode (characteristic #3) the loop bandwidth is relatively small and therefore the response of PLL 919 is relatively slow.

In the implementation of second filter stage 925-2 shown in FIG. 2, resistor R4 is desirable to isolate the output of first filter stage 925-1 (at the collector of transistor Q1) from capacitor C4 for the following reasons. Capacitor C4 has a relatively large capacitance. Without resistor R4 (i.e., if resistor R4 were replaced by a direct connection), the series connection of capacitor C4 and resistor R5 would be directly connected in shunt with the output of first filter stage 925-1 when the tuning system is in the acquisition mode and switching transistor is "on". This would tend to undesirably increase the acquisition time. However, relatively high value resistor R4 isolates the output of first filter stage 925-1 from capacitor C4 and thereby inhibits capacitor C4 from significantly increasing the acquisition time.

Further in regard to relatively high valued capacitor C4, it may be desirable to provide for a predetermined time delay before allowing the fine tuning operation to begin after the acquisition mode to allow capacitor C4 to charge (or discharge) to the tuning voltage generated during the acquisition operation. Such a delay can be provided by microprocessor 19 under program control, as is indicated in the flow chart shown in FIG. 3.

It may be desirable to add a dynamic "speed-up" circuit 925-3 to first filter stage 925-1 as is shown in FIG. 2 to change the response time of PLL 919 so as to speed up the acquisition operation. Speed-up circuit 925-3 includes push-pull configured opposite conductivity type bi-polar transistors Q3 and Q4 and a resistor R7. The commonly connected bases of transistors Q3 and Q4 are connected to one side of Capacitor C1 and the commonly connected emitters are connected via resistor R7 to the other side of capacitor C1. The collectors of transistors Q3 and Q4 are connected to respective sources of opposite polarity supply voltages +VCC and –VCC.

Exemplary component values for external filter network 925 are indicated in the following table.

| Component | Value |
| --- | --- |
| resistor R1 | 24 K (kiloohms) |
| capacitor C1 | 4700 pf (picofarads) |
| capacitor C2 | 0.1 µf (microfarads) |
| resistor R6 | 2 K |
| resistor R7 | 10 K |
| resistor R2 | 1 M (megaohms) |
| capacitor C3 | 0.27 µf |
| resistor R3 | 2 K |
| resistor R4 | 20 K |
| resistor R5 | 470 ohms |
| capacitor C5 | 220 µf |

In operation, when a large frequency change occurs, such as when a new transponder frequency is selected, a large error signal is generated and a corresponding large voltage is developed across resistor R1. Depending on the polarity of the change, one of transistors Q3 or Q4 turns "on" and "sources" or "sinks" current. This causes an effective increase in the loop gain (i.e., characteristic #2 is shifted upward) and a consequential decrease in acquisition time. As PLL 919 nears the desired frequency and the error signal decreases, the "on" transistor is turned "off". A speed-up circuit similar to speed-up circuit 925-3, as well as other speed-up circuits, are described in detail in U.S. patent application Ser. No. 08/504,849, entitled "Fast Acting Control System", filed on Jul. 20, 1995 for David M. Badger, and assigned to the same assignee as the present application.

While the invention has been described by way of example in terms of a specific embodiment for a particular application, it will be appreciated by those skilled in the art that modifications may be made to suit other applications. For example, the invention is not limited to use in a tuning system for a satellite receiver and may be employed whenever the step size of the local oscillator is relatively large with respect to the tracking capability of the carrier recovery loop. In addition, while the invention has been described in terms of receiver in which the response time of the tuning control phase locked loop is increased during the fine tuning mode to selectively change the relative response times of the tuning control phase locked loop and the carrier recovery loop during the fine tuning mode to allow the carrier recovery loop to track frequency changes of said IF signal due to frequency changes of the local oscillator and thereby maintain proper demodulation of said IF signal, it is possible to decrease the response time of the carrier recovery loop during the fine tuning mode. However, increasing the response time of the tuning control phase locked loop is considered preferable, because, as noted above, decreasing the response time of the carrier recovery loop may cause a degradation of the video and audio responses due to a decrease in the signal to noise performance of the demodulator. Further, while the invention has been described with respect to a system which employs a carrier recovery loop for demodulating a QPSK modulated carrier, the invention is also applicable to systems which employ carrier recovery loops for demodulating carriers modulated with digital data in ways, such as QAM (quadrature amplitude modulation). These and other modifications are intended to be within the scope of the invention defined by the following claims.

We claim:

1. Apparatus for processing digital signals modulated on to ones of a plurality of RF carrier signals, comprising:
    a RF input for receiving said plurality modulated RF carrier signals;.
    a tuning control phase locked loop including a local oscillator for generating a local oscillator signal;
    a mixer coupled to said RF input and to said local oscillator for producing an IF signal modulated with digital signals corresponding to a selected RF signal of said plurality of RF signals;
    an IF filter having a center frequency; said IF signal having a nominal frequency corresponding to said center frequency of said IF filter;
    a digital signal demodulator including a carrier recovery loop means for demodulating said IF to produce said digital signals carried by said IF signal; and
    means for controlling the operation of said tuning control phase locked loop in response to at least one control signal generated by said carrier recovery loop which indicates the status of operation of said carrier recovery loop;
    said controlling means controlling said tuning control phase locked loop to (1) establish an initial local oscillator frequency corresponding to said selected RF signal during an acquisition mode starting when said selected RF signal is initially selected and ending when said second closed loop is properly demodulating said IF signal, and (2) change the local oscillator frequency from said initial local oscillator frequency to a reduce a frequency offset of said IF signal from said nominal IF frequency during a fine tuning mode;
    said controlling means further selectively changing the relative response times of said tuning control phase locked loop and said carrier recovery loop during said fine tuning mode to allow said carrier recovery loop to track frequency changes of said IF signal due to changes of said local oscillator frequency and thereby maintain the proper demodulation of said IF signal.

2. The apparatus recited in claim 1, wherein:
    the frequency of said local oscillator is changed in steps large enough during said fine tuning mode to temporarily interrupt the proper demodulation of said IF signal by said digital demodulator due to the inability of said carrier recovery loop to quickly enough track said large step changes of the frequency of said local oscillator.

3. The apparatus recited in claim 1, wherein:
    said RF signals have frequencies which is greater than the frequency range used for conventional terrestrial broadcast and cable television transmissions; and
    said phase locked loop means comprises a phase locked loop tuning control integrated circuit normally employed in a terrestrial broadcast and cable television receiver.

4. The apparatus recited in claim 3, wherein:
    said RF input is adapted to receive said RF signal from a block converter which is capable of offsetting the frequencies of said RF carrier signals form respective nominal frequencies.

5. The apparatus recited in claim 1, wherein:
    said RF signals are QPSK modulated with said digital signals; and
    said demodulator is a QPSK demodulator.

6. The apparatus recited in claim 1, wherein:
    said controlling means increases the response time of said tuning control phase locked loop during said fine tuning mode.

7. The apparatus recited in claim 6, wherein:
    said tuning control phase locked loop includes a controllable filter which determines the response time of said tuning control phase locked loop; and
    said controlling means controls said filter for to increase the response time of said tuning control phase locked loop during said fine tuning mode.

8. The apparatus recited in claim 7, wherein:
    said filter includes first and second filter stages; and
    said controlling means controls said second filter section to increase the response time of said first closed loop means during said fine tuning mode.

9. The apparatus recited in claim 8, wherein:
    said local oscillator is responsive to a tuning control signal which determines its frequency of oscillation;
    said first closed loop includes means for comparing the frequency of oscillation of said local oscillator to a reference value to generate an error signal;
    said filter is coupled to said comparing means for filtering said error signal to produce said tuning control signal for said local oscillator;

said first and second filter stages are coupled in cascade between said comparing means and said local oscillator; and said second filter stage includes a filter section and a switching section for selectively bypassing and said filter section of said second filter stage under the control of said controlling means.

10. The apparatus recited in claim 9, wherein:

said comparing means is coupled to said filter means via an amplifier; and said first filter stage includes an a filter section which is coupled in a negative feedback configuration with said amplifier.

11. Apparatus for processing digital signals modulated on to ones of a plurality of RF carrier signals, comprising:

a RF input for receiving said plurality modulated RF carrier signals;

a first closed loop means including a local oscillator for generating a local oscillator signal;

a mixer coupled to said RF input and to said local oscillator for producing an IF signal modulated with digital signals corresponding to a selected RF signal of said plurality of RF signals;

an IF filter having a center frequency; said IF signal having a nominal frequency corresponding to said center frequency of said IF filter;

a digital signal demodulator including a second closed loop means for demodulating said IF to produce said digital signals carried by said IF signal; and means for controlling the operation of said first closed loop means in response to at least one control signal generated by said second closed loop means which indicates the status of operation of said second closed loop means;

said controlling means controlling said first closed loop means to (1) establish an initial local oscillator frequency corresponding to said selected RF signal during an acquisition mode starting when said selected RF signal is initially selected and ending when said second closed loop is properly demodulating said IF signal, (2) maintain said initial local oscillator frequency during a steady-state mode, and (3) change the local oscillator frequency from said initial local oscillator frequency to a reduce a frequency offset of said IF signal from said nominal IF frequency during a fine tuning mode;

said controlling means further controlling said first closed loop means to increase the response time of said first closed locked loop means to allow said second closed loop means to track frequency changes of said IF signal due to frequency changes of said local oscillator and thereby maintain the proper demodulation of said IF signal during said fine tuning mode.

12. The apparatus recited in claim 11, wherein:

said RF signals have frequencies which is greater than the frequency range used for conventional terrestrial broadcast and cable television transmissions; and said first close loop means comprises a phase locked loop tuning control integrated circuit normally employed in a terrestrial broadcast and cable television receiver.

13. The apparatus recited in claim 11, wherein:

said RF input is adapted to receive said RF signal from a block converter which is capable of offsetting the frequencies of said RF carrier signals form respective nominal frequencies.

14. The apparatus recited in claim 11, wherein:

said first closed loop means is a phase locked loop; and said second closed loop means is a carrier recovery loop.

15. The apparatus recited in claim 14, wherein:

said RF signals are QPSK modulated with said digital signals; and said demodulator is a QPSK demodulator.

16. The apparatus recited in claim 11, wherein:

said first control loop means includes a controllable filter which determines the response time of said first close loop means; and said controlling means controls said filter for to increase the response time of said first closed loop means during said fine tuning mode.

17. The apparatus recited in claim 16, wherein:

said filter includes first and second filter stages; and said controlling means controls said second filter section to increase the response time of said first closed loop means during said fine tuning mode.

18. The apparatus recited in claim 17, wherein:

said local oscillator is responsive to a tuning control signal which determines its frequency of oscillation;

said first closed loop includes a means for comparing the frequency of oscillation of said local oscillator to a reference value to generate an error signal;

said filter is coupled to said comparing means for filtering said error signal to produce said tuning control signal for said local oscillator;

said first and second filter stages are coupled in cascade between said comparing means and said local oscillator; and said second filter stage includes a filter section and a switching section for selectively bypassing and said filter section of said second filter stage under the control of said controlling means.

19. The apparatus recited in claim 18, wherein:

said comparing means is coupled to said filter means via an amplifier; and said first filter stage includes a filter section which is coupled in a negative feedback configuration with said amplifier so as to form an integrator;

said comparing means and said amplifier are included in an integrator circuit;

said filter section of said first filter stage, said filter section of said second filter stage are external to said integrated circuit.

20. Apparatus for processing digital signals modulated on to ones of a plurality of RF carrier signals, comprising:

a RF input for receiving said plurality modulated RF carrier signals;

a first closed loop means including a local oscillator for generating a local oscillator signal;

a mixer coupled to said RF input and to said local oscillator for producing an IF signal modulated with digital signals corresponding to a selected RF signal of said plurality of RF signals;

an IF filter having a center frequency; said IF signal having a nominal frequency corresponding to said center frequency of said IF filter;

a digital signal demodulator including a second closed loop means for demodulating said IF to produce said digital signals carried by said IF signal; and means for controlling the operation of said first closed loop means in response to at least one control signal generated by said second closed loop means which indicates the status of operation of said second closed loop means;

said controlling means controlling said first closed loop means to (1) establish an initial local oscillator frequency corresponding to said selected RF signal during an acquisition mode starting when said selected RF signal is initially selected and ending when said second closed loop is properly demodulating said IF signal, (2) maintain said initial local oscillator frequency during a steady-state mode, and (3) change the local oscillator frequency from said initial local oscillator frequency to a reduce a frequency offset of said IF signal from said nominal IF frequency during a fine tuning mode;

said first closed loop means having a first response time during said acquisition mode, a second response time greater than said first response time during a steady state mode, and a third response time greater than said second response time during said fine tuning mode.

\* \* \* \* \*